United States Patent

Sugimoto et al.

[11] Patent Number: 6,040,620
[45] Date of Patent: Mar. 21, 2000

[54] LEAD FRAME FOR LOC HAVING A REGULATING LEAD TO PREVENT VARIATION IN ADHESIVE COVERAGE

[75] Inventors: Hiroshi Sugimoto; Shigeo Hagiya; Noriaki Taketani; Takaharu Yonemoto; Osamu Yoshioka, all of Ibaraki, Japan

[73] Assignee: Hitachi Cable, Ltd., Tokyo, Japan

[21] Appl. No.: 08/888,121

[22] Filed: Jul. 3, 1997

[30] Foreign Application Priority Data

Jul. 5, 1996 [JP] Japan .................................. 8-176114
Jul. 5, 1996 [JP] Japan .................................. 8-176115

[51] Int. Cl.⁷ .................................. H01L 23/495
[52] U.S. Cl. .................. 257/666; 257/667; 257/669; 257/674
[58] Field of Search .................. 257/666, 667, 257/669, 674

[56] References Cited

U.S. PATENT DOCUMENTS 4,280,132  7/1981  Hayakawa et al. .......... 257/667
5,545,920  8/1996  Russell ........................ 257/666
5,606,199  2/1997  Yoshigai ...................... 257/666
5,663,594  9/1997  Kimura ........................ 257/666

FOREIGN PATENT DOCUMENTS 4-75355  3/1992  Japan .

Primary Examiner—Valencia Martin-Wallace
Assistant Examiner—George C. Eckert, II
Attorney, Agent, or Firm—McDermott, Will & Emery

[57] ABSTRACT

A lead frame for LOC is provided which can reduce a variation in coverage of an insulating adhesive, permitting the fixation of a semiconductor chip and wire bonding to be stably performed. In a lead frame for LOC 10 wherein an insulating adhesive for fixing a semiconductor chip is applied to inner leads 11 in their semiconductor chip mounting region, a coverage regulating lead 14 is provided outside the semiconductor chip mounting region and adjacent to inner leads 11a, 11b located at the end of the semiconductor chip mounting region, permitting the insulting adhesive to be homogeneously applied to each of the inner leads 11 without creating any variation in coverage of the adhesive.

4 Claims, 2 Drawing Sheets

LEAD FRAME FOR LOC HAVING A REGULATING LEAD TO PREVENT VARIATION IN ADHESIVE COVERAGE

BACKGROUND OF THE INVENTION

1. Field of the Invention

The present invention relates to a lead frame for a semiconductor device and in particular to a lead frame for LOC used in a semiconductor which is subjected to mold packaging in an LOC structure.

2. Description of the Related Art

Lead frames for semiconductor devices having an LOC (lead on chip) structure or the like, which can realize high density assembly, are known in the art. One of them is a lead frame used in a system where a high heat-resistant insulating film coated with a thermoplastic or thermosetting adhesive layer is applied to one side or both sides of the lead frame and a semiconductor chip is mounted on the high heat-resistant insulating film under heating or under pressure.

For the lead frame in this system, it is common practice to use a polyimide film as the high heat-resistant insulating film and, in the application of the film to the lead frame, die stamping application is used. Specifically, a film in a reel form is stamped by means of a die into a desired shape and then applied to the lead frame under heating or under pressure.

According to this method, the film is stamped by means of a die, and the stamped film is then applied to the lead frame in its desired position. Therefore, the amount of the tape used is large, resulting in increased cost. Further, since stamping of the film produces a waste film, the material is wasted. Furthermore, absorption of moisture into the polyimide film leads to a fear of package cracks being created.

In order to eliminate such inconvenience, a method has been proposed which comprises: coating an adhesive onto a lead frame in its area where a semiconductor device is to be mounted; and jointing (bonding) the semiconductor device to the lead frame with the aid of this adhesive.

For the coating of the adhesive, & device comprising a combination of an X-Y robot with a dispenser is generally used to coat the adhesive onto a lead frame in its area where a semiconductor device is to be mounted (for example, a front end of an inner lead). In particular, when an adhesive is applied to the front end of the lead, a spot coating method is used. In this method, what is required is only to coat a required amount of the adhesive onto the lead frame. Therefore, no waste material is produced, and no expensive die is required, advantageously resulting in reduced production cost.

A varnish adhesive (for example, a solution of an adhesive resin in a solvent) is coated by ejecting the adhesive through a capillary needle (or nozzle) by means of air pressure onto a lead frame in its predetermined area while moving the needle (or nozzle) on the lead frame.

FIG. 1 is a plan view of a conventional lead frame coated with an insulating adhesive. A lead frame 1 comprises: inner leads 2 concentrated in a semiconductor chip mounting region and provided so as to face each other from both directions; outer leads 3 connected respectively to the inner leads 2 and provided parallel to one another; a tie bar 4, provided on the outer leads 3 in their portions to be exposed after plastic molding, so as to connect the leads to one another; and a frame section 5 provided on both sides of the frame so as to support the tie bar 4.

In a lead frame having such a structure, an insulating adhesive 6 is coated by the above method onto the front end of the inner leads 2. A semiconductor chip (not shown) is mounted inside a chip shape line 7 indicated in FIG. 1. The semiconductor chip, when mounted, is bonded to the insulating adhesive 6 on the leads under heating or under pressure.

According to the lead frame using the conventional adhesive coating means, a varnish adhesive is placed in a container and ejected from the container with the aid of air pressure. In this case, a time lag is created between the initiation of the pressurization and the incitation of the ejection. This appears as a change in adhesive in the container. Further, when the application of air pressure is stopped, the ejection of the adhesive is not immediately stopped due to the influence of the residual pressure or the like in the container. For this reason, the coverage of the adhesive is instable at the time of the initiation of the costing and the termination of the coating. A large variation in coverage of the adhesive adversely affects the fixation of the semiconductor chip and wire bonding.

SUMMARY OF THE INVENTION

An object of the present invention is to provide a lead frame for LOC which can reduce a variation in coverage of the insulating adhesive and enables fixation of a semiconductor chip and wire bonding to be stably performed.

The above object can be attained, according to the present invention, by a lead frame for LOC including a plurality of inner leads for mounting a semiconductor chip at front ends thereof, an insulating adhesive material for fixing a semiconductor chip on the plurality of inner leads, and an additional lead for regulating coverage of the insulating adhesive material. In the present invention the insulating adhesive material is coated on a portion of the plurality of inner leads located within a semiconductor chip mounting region. The additional lead is located outside the semiconductor chip mounting region and adjacent to one of the plurality of inner leads which is located in an outermost position in the semiconductor chip mounting region. Furthermore, the additional lead is coated at a front end thereof with the insulating adhesive material.

According to the above constitution, upon the initiation of coating of an insulating adhesive in a varnish form, the adhesive is coated on a coverage regulating lead provided outside the semiconductor chip mounting region. After the pressure fluctuation in the container is settled, the adhesive is ejected from the container onto the inner leads. Similarly, upon the termination of the ejection, the adhesive is ejected from the container onto a coverage regulating lead provided adjacent to the last inner lead to avoid the influence on the coating of the adhesive onto the last inner lead. This enables the adhesive to be coated onto each inner lead without creating any variation in coverage of the adhesive. Therefore, the fixation of a semiconductor chip and wire bonding can be stably performed.

According to a preferred embodiment of the present invention, the coverage regulating lead is linked to an inner lead located within the semiconductor chip mounting region.

In this constitution, a coverage regulating lead car, be provided so as to be branched from the outermost inner lead of both sides, permitting the production process and cost to be held on a level comparable with the conventional constitution.

PREFERRED EMBODIMENTS OF THE INVENTION

A preferred embodiment of the present invention will be described with reference to the accompanying drawings.

Figure 1:
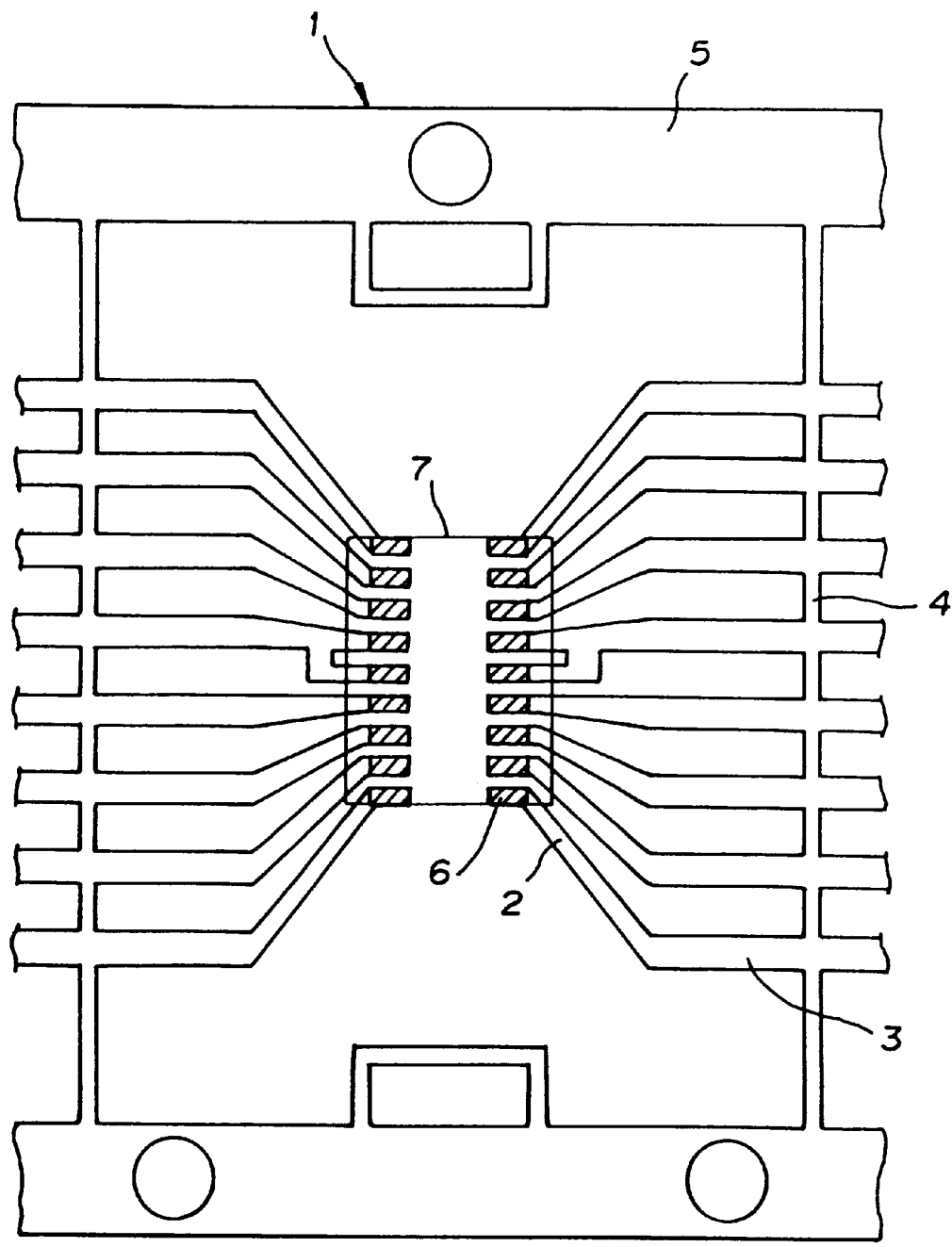
FIG. 1 is a plan view of a conventional lead frame coated with an insulating adhesive.
Figure 2:
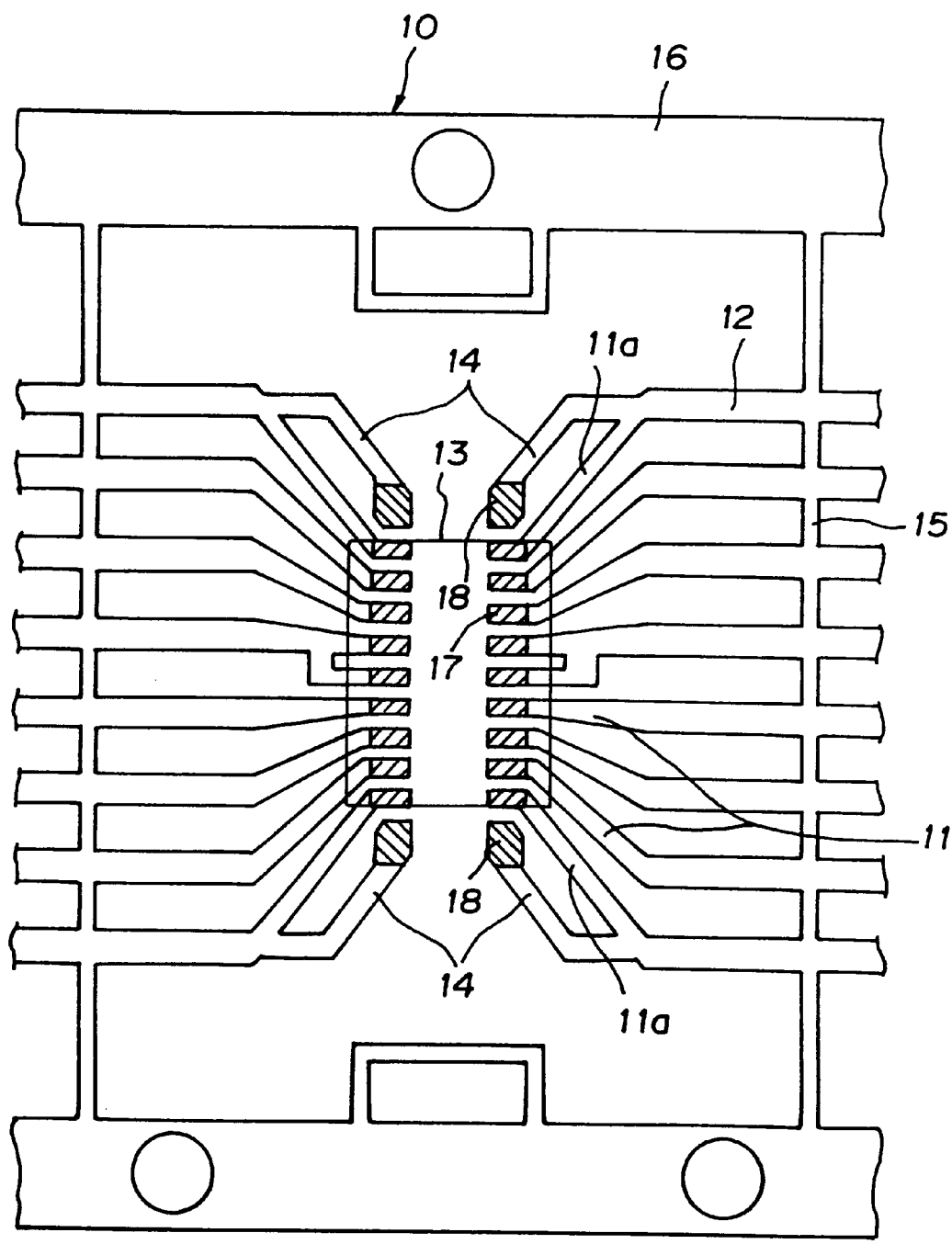
FIG. 2 is a plan view of a lead frame for LOC according to the present invention.

FIG. 2 is a plan view of a lead frame for LOC according to the present invention.

A lead frame 10 is composed mainly of inner leads 11 and outer leads 12. The inner leads 11 are fabricated so as for the front ends to be arranged within a chip shape line 13, which is a semiconductor chip (not show) mounting region, and provided so as to face each other from both directions. A coverage regulating lead 14 is provided in the vicinity of the chip shape line 13 on both sides (upper and lower ends in FIG. 2) of the group of inner leads and linked to each adjacent inner lead 11a in its portion near the boundary between the inner lead 11 and the outer lead 12.

The outer leads 12 are connected to the respective inner leads 11 (in some leads, two inner leads being connected in parallel to one outer lead 12) and provided in parallel to one another. A tie bar 15 is provided, on the outer leads 12 in their portions to be exposed after plastic molding, so as to connect the leads to one another. Further, a wide frame section 16 is provided on both sides of the frame so as to support the tie bar 15.

In a lead frame 10 having the above structure, an insulating adhesive 17 is coated onto the front end of the inner leads 11, and an insulating adhesive 18 is coated onto the front end of the coverage regulating lead 14. For example, an adhesive in a varnish form prepared by dissolving a thermoplastic adhesive having a glass transition temperature of 220° C. in a solvent may be used as the insulting adhesives 17, 18. A dispenser may be used for coating the adhesive. Specifically, an insulating adhesive dissolved in a varnish form is placed in a container, into which air can be externally fed, and the adhesive contained in the container is directed to a needle through which the adhesive is ejected onto the leads.

As described above, the coverage of the adhesive is instable at the time of the initiation of the coating and the termination of the coating. A large variation in coverage of the adhesive adversely affects the fixation of a semiconductor chip or wire bonding. Therefore, in the present invention, coating at the time of the initiation of the coating and the termination of the coating is performed on a coverage regulating lead 14. Since the coverage regulating lead 14 is located outside the chip shape line 13, the insulating adhesive 18 coated on the coverage regulating lead 14 is not used in the fixation of a semiconductor chip. Therefore, a variation in coverage of the adhesive on the coverage regulating lead 14 poses no problem.

When the needle is transferred from the coverage regulating lead 14 to the adjacent inner lead 11, the air pressure fed into the container is in a stable state and, thereafter, the adhesive is stably coated on the inner leads 11, offering an even coating thickness, when the coating to the end of the inner leads 11 is completed and the needle is transferred to the coverage regulating lead 14 located at the lower end, the feed of air into the container is stopped causing a fluctuation in pressure in the container. Since, however, as described above, the needle is located outside the chip shape line 13, this fluctuation does not affect the mounting of the semiconductor chip.

As described above, according to the present invention, an insulating adhesive can be coated onto each inner lead in a semiconductor chip mounting region without creating any variation in coverage, enabling the fixation of a semiconductor chip and wire bonding to be stably performed, which can improve the reliability of the semiconductor device. Further, a lead frame having such properties can be produced at low cost.

What is claimed is:

1. A lead frame for LOC, comprising:

a plurality of inner leads for mounting a semiconductor chip at front ends thereof;

an insulating adhesive material for fixing a semiconductor chip on said plurality of inner leads, said insulating adhesive material being coated on a portion of said plurality of inner leads located within a semiconductor chip mounting region; and an additional lead for regulating coverage of said insulating adhesive material, said additional lead being located outside said semiconductor chip mounting region and adjacent to one of said plurality of inner leads which is located in an outermost position in said semiconductor chip mounting region;

said additional lead being coated at a front end thereof with said insulating adhesive material.

2. The lead fame for LOC according to claim 1, wherein said additional lead is attached to one of said plurality of inner leads located adjacent thereto.

3. A lead frame for LOC, comprising:

a plurality of inner leads for mounting a semiconductor chip at front ends thereof, said front ends of said plurality of inner leads being located inside a semiconductor chip mounting region;

insulating adhesives coated to be linearly arranged on said front ends of said plurality of inner leads;

additional leads provided on both outsides of said semiconductor chip mounting region; and additional insulative adhesives coated on front ends of said additional leads to be linear with said insulative adhesives coated on said front ends of said plurality of inner leads.

4. The lead frame for LOC according to claim 3, wherein a first one of said additional leads is coated with an adhesive at a starting stage for providing said insulative adhesives coated on said front ends of said plurality of inner leads; and a second one of said additional leads is coated with an insulative adhesive at a finishing stage for providing said insulative adhesives coated on said front ends of said plurality of inner leads.

* * * * *